US008040663B1

(12) United States Patent
Czarnecki

(10) Patent No.: US 8,040,663 B1
(45) Date of Patent: Oct. 18, 2011

(54) SEQUENCED SEPARATELY-DERIVED TRANSFER SWITCH CAPABLE OF SWITCHING A LOAD BETWEEN A PAIR OF POWER SUPPLIES WITHOUT INTRODUCING OPEN NEUTRAL SWITCHING TRANSIENTS

(75) Inventor: Neil A. Czarnecki, Mt. Pleasant, WI (US)

(73) Assignee: Reliance Controls Corporation, Racine, WI (US)

(*) Notice: Subject to any disclaimer, the term of this patent is extended or adjusted under 35 U.S.C. 154(b) by 469 days.

(21) Appl. No.: 12/174,290

(22) Filed: Jul. 16, 2008

(51) Int. Cl.
*H02B 11/133* (2006.01)
*H05K 5/02* (2006.01)
*H05K 5/03* (2006.01)
*H01H 9/20* (2006.01)

(52) U.S. Cl. ........ 361/632; 361/631; 361/634; 361/635; 361/643; 361/616; 200/50.32; 200/50.33; 200/50.4

(58) Field of Classification Search .................. 361/631, 361/632, 634, 635, 643, 616; 200/50.32, 200/50.33, 50.4
See application file for complete search history.

(56) References Cited

U.S. PATENT DOCUMENTS

| | | | | |
|---|---|---|---|---|
| 4,270,031 | A * | 5/1981 | Borona et al. | 200/50.33 |
| 5,204,803 | A | 4/1993 | Runge | |
| 5,648,646 | A | 7/1997 | Flegel | |
| 5,805,414 | A | 9/1998 | Feldhaeusser | |
| 5,835,341 | A | 11/1998 | Rhodes et al. | |
| 5,963,420 | A * | 10/1999 | Bailey et al. | 361/616 |
| 5,977,492 | A * | 11/1999 | Taylor et al. | 200/50.32 |
| 6,031,193 | A | 2/2000 | Flegel | |
| 6,069,328 | A * | 5/2000 | Oravetz et al. | 200/50.33 |
| 6,096,986 | A | 8/2000 | Flegel | |
| 6,184,595 | B1 * | 2/2001 | Flegel, Jr. | 307/114 |
| 6,521,849 | B1 | 2/2003 | Flegel | |
| 6,534,735 | B1 * | 3/2003 | Czarnecki | 200/333 |
| 6,541,718 | B2 * | 4/2003 | Burkholder et al. | 200/50.28 |
| 6,621,689 | B1 * | 9/2003 | Flegel | 361/631 |
| 6,927,349 | B1 | 8/2005 | Flegel et al. | |
| 7,238,898 | B1 * | 7/2007 | Czarnecki | 200/50.32 |
| 7,446,270 | B2 * | 11/2008 | Somalingayya et al. | 200/50.32 |
| 7,462,791 | B1 * | 12/2008 | Flegel | 200/50.32 |
| 7,531,762 | B2 * | 5/2009 | Flegel | 200/50.32 |
| 7,616,432 | B2 * | 11/2009 | Luebke et al. | 361/631 |
| 7,800,512 | B1 * | 9/2010 | Czarnecki | 340/693.1 |
| 7,834,486 | B1 * | 11/2010 | Flegel et al. | 307/126 |
| 2002/0125115 | A1 * | 9/2002 | Burkholder et al. | 200/51.11 |
| 2007/0278071 | A1 * | 12/2007 | Flegel | 200/50.33 |
| 2008/0190747 | A1 * | 8/2008 | Carson et al. | 200/50.1 |
| 2010/0038966 | A1 * | 2/2010 | Espeut, Jr. | 307/68 |

OTHER PUBLICATIONS

"Main Lugs Generator Panel", Schneider Electric, www.Schneider-electric.ca/www/en/products/stab-lok/html/lugsgenerator.htm, Mar. 26, 2004, 3 pages.

* cited by examiner

*Primary Examiner* — Anatoly Vortman
(74) *Attorney, Agent, or Firm* — Boyle Fredrickson, S.C.

(57) ABSTRACT

An interlock arrangement includes a pair of slidable lockouts operatively associated with utility and generator side switches of an electrical panel. Together with either an interlinked member or a rocker lockout, the interlock arrangement sequences manual switching of the utility and generator side switches according to a pre-defined switching sequence, such as a seven step sequence or a five step sequence.

20 Claims, 8 Drawing Sheets

FIG. 14
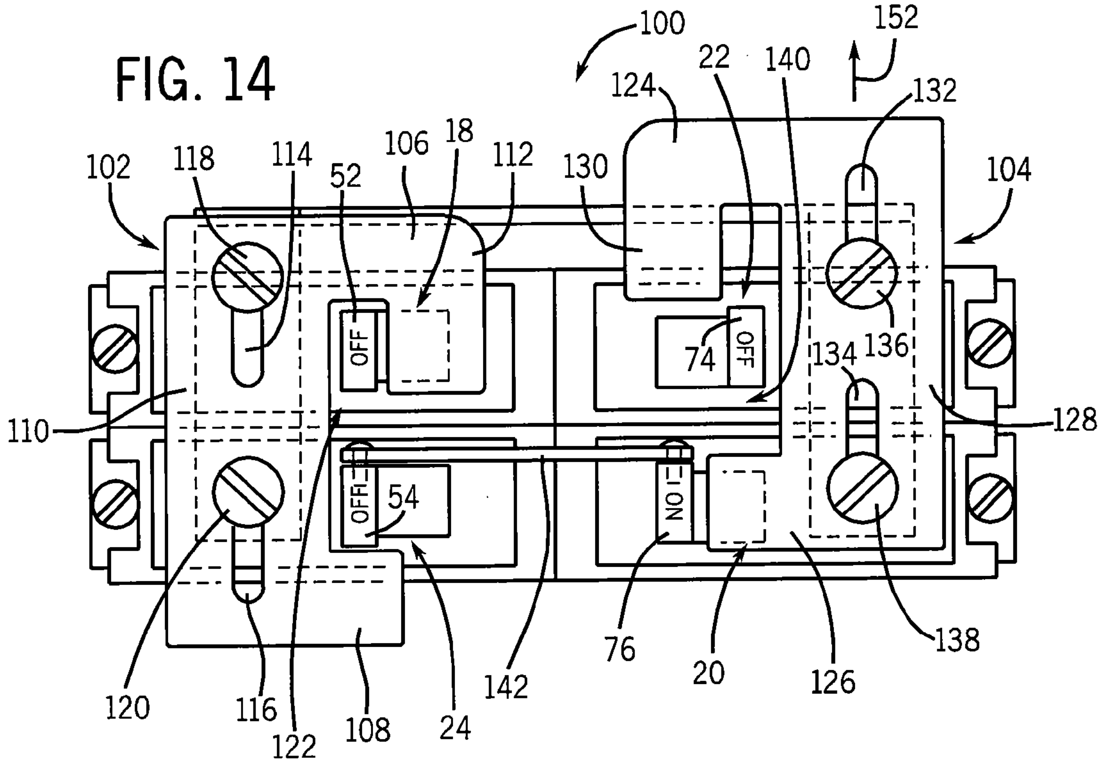
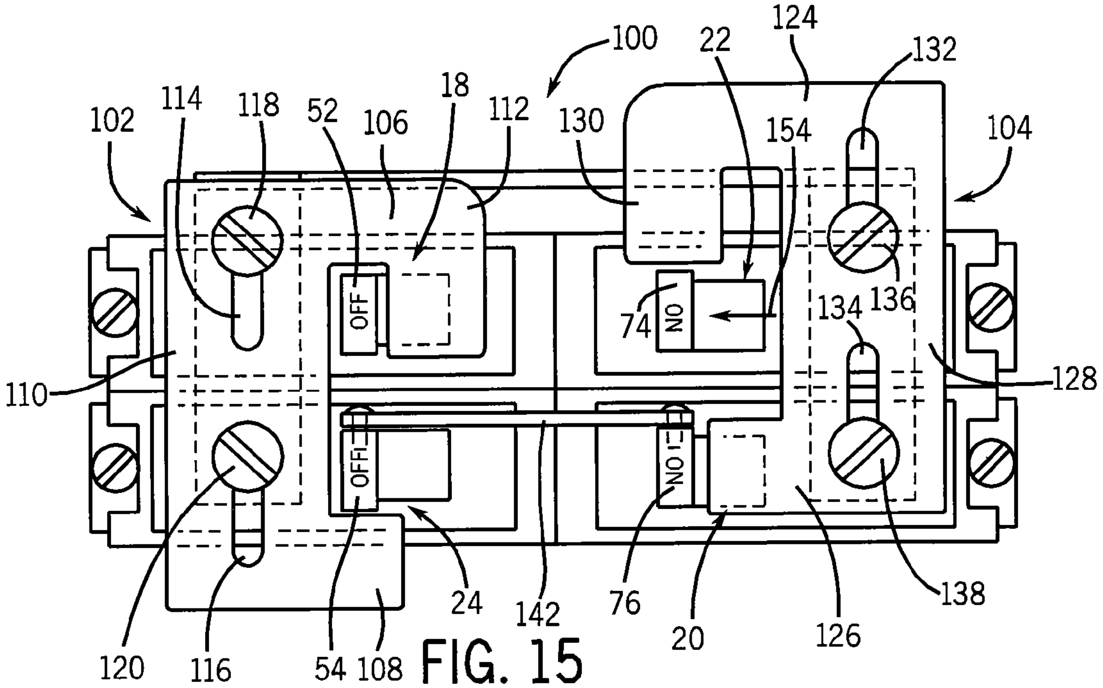
FIG. 15

SEQUENCED SEPARATELY-DERIVED TRANSFER SWITCH CAPABLE OF SWITCHING A LOAD BETWEEN A PAIR OF POWER SUPPLIES WITHOUT INTRODUCING OPEN NEUTRAL SWITCHING TRANSIENTS

BACKGROUND AND SUMMARY OF THE INVENTION

This invention relates to a transfer switch and, more particularly, to a separately-derived transfer switch having a lockout sequencing arrangement that sequences manual switching of a load between power supplies to prevent open neutral transients during the switching.

In an electrical supply system, there are occasions when an alternate source of electric power is necessary or desirable. For example, the capability of switching from utility power to emergency generator power is important for businesses, hospitals and industries, and is also employed in residential applications.

It is desirable for separate electrical circuits, or separate groups of electrical circuits, to be arranged so that when one group of circuits is switched to a conductive state, another group of circuits is switched to a non-conductive state so as to prevent power supply to the circuits from two different power sources at the same time, e.g. from both a utility power supply and a generator power supply. In an arrangement such as this, a switch is typically provided for each power source to control the supply of electrical power. Accordingly, it is important to ensure that the switches are prevented from both being in the ON position at the same time, to ensure that power is supplied to the switch from only one power source.

To this end, switch interlocks have been developed that are designed to prevent simultaneous connection of circuits to two different power sources, such as described in U.S. Pat. No. 6,096,986, the disclosure of which is incorporated herein and assigned to the assignee of the present application. For some transfer switches, providing linkages that prevent the inadvertent switching of circuits to two power supplies is sufficient. However, for some types of transfer switches, more than an interlock is needed. For instance, if a separately-derived transfer switch is not properly switched, open neutral switching transients may be introduced.

The present invention is directed to sequencing lockout arrangement for use with a separately-derived transfer switch that sequences manual switching of main and generator side switches to prevent the introduction of open neutral switching transients. A separately-derived transfer switch typically includes a utility mains breaker and a utility mains neutral switch as well as a generator mains breaker and a generator mains neutral switch. In one embodiment of the present invention, two slidable lockout sequencers together with a rocker lockout functions to sequence switching of a load from one power source to another power source. In this embodiment, seven separate operations must be performed to switch the load between power sources. In another embodiment, the utility mains neutral and generator mains neutral switches are linked together such that switching of the utility mains neutral to a conductive position automatically switches the generator mains neutral switch to a non-conductive position, and vice-versa. In this embodiment, five separate operations are required to switch a load between power sources.

The slidable lockout sequencers together with the rocker lockout in the first-mentioned embodiment allow only one of the utility mains breaker, the utility mains neutral switch, the generator mains breaker, and the generator mains neutral switch to be switched at a time. Moreover, the lockout sequencers and the rocker lockout cooperate such that a predefined order or sequence of the one-at-a-time switching must be followed to switch a load from one power source to another. The slidable lockout sequencers similarly define the sequence of switching with the interlinked neutral switches of the second-mentioned embodiment. Thus, in both embodiments, the slidable lockout sequencers provide limited and ordered switching of the utility and generator switches.

Thus, it is one object of the present invention to provide a lockout arrangement for use with a separately-derived transfer switch that is operable to prevent open neutral switching transients.

It is another object of the present invention to provide a separately-derived transfer switch having a pair of slidable members that restrict movement of switch handles such that a load is switched from one power source to another in a predefined, unalterable sequence.

In accordance with one aspect of the present invention, these and other objects are achieved with a lockout arrangement having a first slidable lockout movable between a first position and a second position, and a second slidable lockout movable between a third position and a fourth position. A third lockout is movable between a fifth and a sixth position. Further, the third lockout is only movable from the fifth position to the sixth position if the first slidable lockout is in the second position.

In accordance with another aspect, the invention is directed to a separately-derived transfer switch having a first mains breaker associated with a first power supply and a second mains breaker associated with a second power supply. The transfer switch further includes a first mains neutral switch and a second mains neutral switch associated with the first and the second power supplies, respectively. A lockout sequencing arrangement has a first lockout that restricts simultaneous switching of the first mains breaker and the first mains neutral switch and further includes a second lockout that restricts simultaneous switching of the second mains breaker and the second mains neutral switch. In a further aspect, the lockout sequencing arrangement includes a third lockout that prevents the first mains neutral switch and the second mains neutral switch from being both in a conductive position simultaneously. In one embodiment, the third lockout interlinks the first and the second neutral switches.

The present invention may also be embodied in a method of disconnecting a load from a utility power supply and connecting the load to a generator. The method includes switching a first mains breaker from an ON position to an OFF position and then sliding a first side lockout from a first position to a second position. The method continues with switching a first mains neutral switch from an ON position to an OFF position followed by switching a second mains neutral switch from an OFF position to an ON position. A second side lockout may then be switched from a third position to a fourth position followed by switching a second main breaker from an OFF position to an ON position. The above series of steps may be performed in a reverse order to disconnect the load from the generator and to connect the load to the utility power supply. In one embodiment, the first mains neutral and the second mains neutral switching operations are performed simultaneously by interlinking the neutral switches.

Various other features, objects and advantages of the invention will be made apparent from the following description taken together with the drawings.

BRIEF DESCRIPTION OF THE DRAWINGS

The drawings illustrate the best mode presently contemplated of carrying out the invention.

In the drawings:

FIG. 14 is a front elevation view of the transfer panel shown in FIG. 10 with the generator side lockout sequencer having been slid to free the generator mains breaker; and FIG. 15 is a front elevation view of the transfer panel shown in FIG. 10 with the generator mains breaker switch moved to the ON position thereby resulting in connection of a load to the generator power supply.

DETAILED DESCRIPTION OF THE INVENTION

Figure 1:
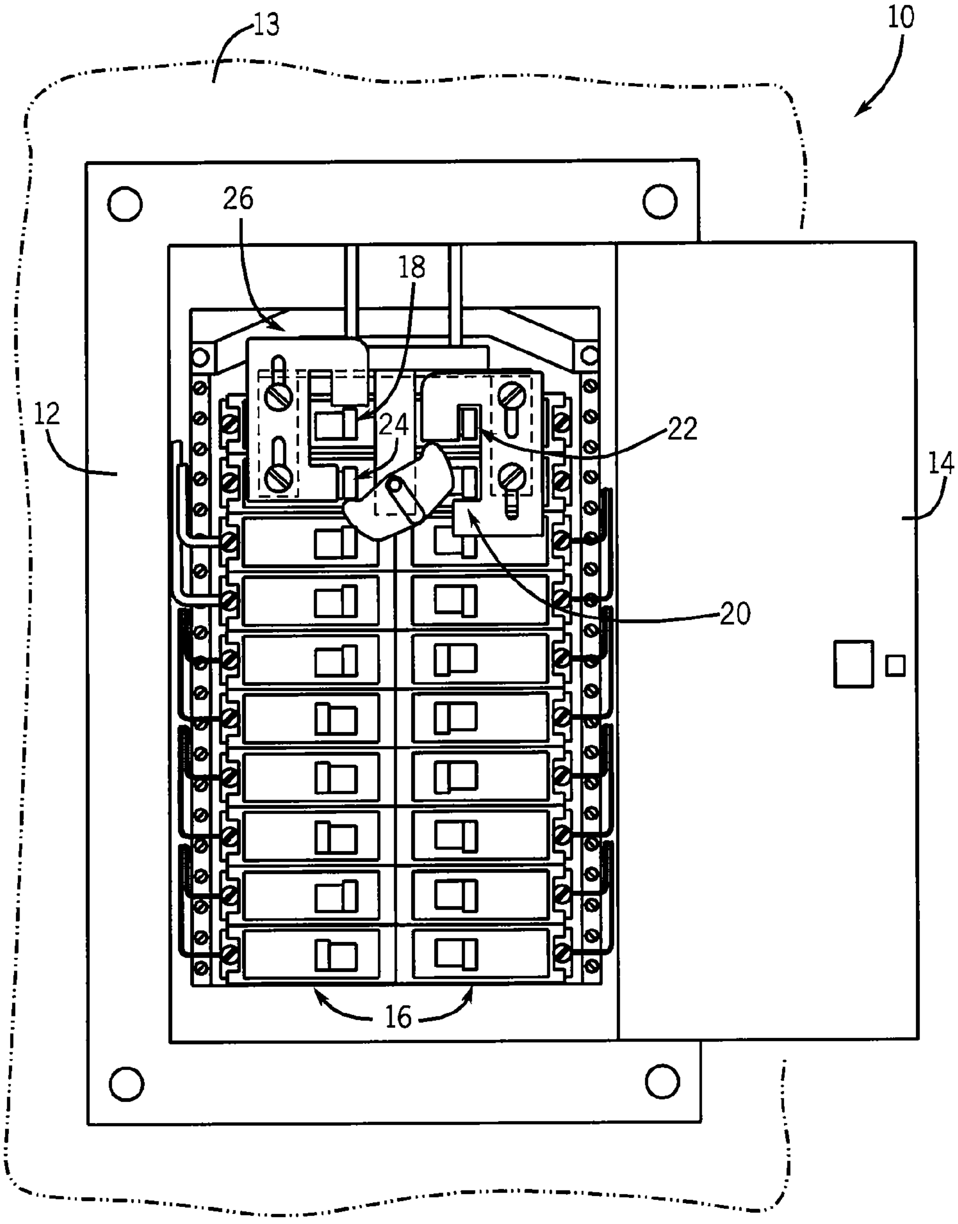
FIG. 1 is a front elevation view of a transfer panel containing a utility mains breaker, a utility mains neutral switch, a generator mains breaker, and a generator mains neutral switch together with a lockout arrangement containing two slidable lockout sequencers and a rocker lockout according to one embodiment of the present invention and shown with the utility mains breaker and the mains neutral switch in an ON position and the generator mains breaker and the generator mains neutral switch in an OFF position.

FIG. 1 shows a load center assembly 10 according to one embodiment of the present invention, which is configured to supply power to a series of electrical circuits from one of at least two power sources. Representatively, load center assembly 10 controls the supply of power to the electrical circuits from a primary power source, such as utility power, and an alternate or secondary power source, such as an electric generator, which is adapted to supply power in the event power from the primary power source is unavailable. Typically, the alternate or secondary power source is an electric generator, although it is understood that any other source of secondary or alternate power may be employed. The following description utilizes terminology which makes reference in various instances to a generator, and it is understood that such terminology is used for the sake of convenience and that the term "generator" is meant to encompass any secondary or alternate power source, and is not limited to a generator as the alternate power source. Similarly, it is understood that use of the term "utility" is meant to encompass any primary power source, and is not limited to power provided through a utility company power grid.

Load center assembly 10 includes a cover 12 adapted to be mounted to wall 13 and having a door 14 pivotably connected thereto. Cover 12 includes a series of knockouts constructed to be removed as load breakers 16 are added. In the illustrated embodiment, each of the knockouts has been removed and loaded with breakers 16. Further, in the illustrated embodiment, the knockouts, and thus breakers 16, are arranged in two columns, but it is understood that other layouts are possible. A utility mains switch or breaker 18 is constructed to be connected to a utility power input. A generator mains neutral switch 20, generator mains breaker 22, and a utility mains neutral switch 24 are constructed to be electrically connected to the respective power sources, as known in the art. The load center assembly 10 further has an interlock assembly 26 that prevents the inadvertent connection of the utility power input via utility mains breaker 18 and generator power input via generator mains breaker 22 from being concurrently connected to the load terminals of the load center assembly 10. As will be explained, the interlock assembly 26 also controls movement of the neutral switches 20, 24 to ensure that the breakers and switches are actuated in a predefined sequence.

Figure 2:
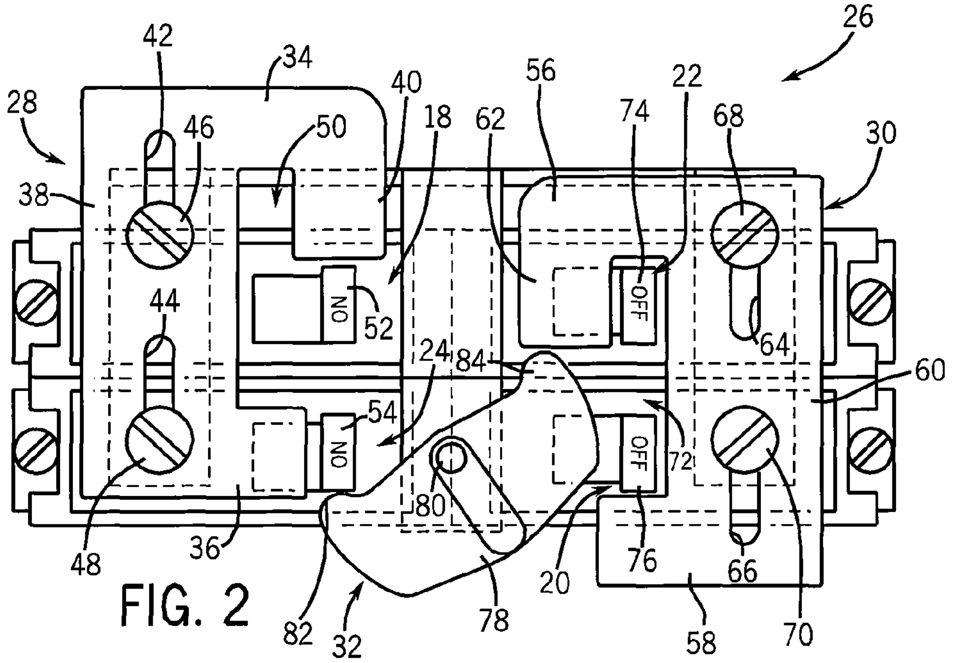
FIG. 2 is an enlarged view of the transfer panel of FIG. 1 showing the utility mains breaker and the utility mains neutral switch in the ON position and the generator mains breaker and the generator mains neutral switch in the OFF position.

Referring now to FIG. 2, the interlock assembly 26 includes a pair of slidable lockouts 28, 30 and a centrally positioned rocker lockout 32. Lockout 28 is associated with the utility mains breaker 18 and the utility mains neutral switch 24, and thus will be referred to as "utility side lockout" whereas lockout 30 is associated with the generator mains breaker 22 and the generator mains neutral switch 20, and thus will be referred to as "generator side lockout".

The utility side lockout 28 includes a header 34, a shorted base 36, a first leg 38, and a second shortened leg 40. It is understood that the lockout 28 may fabricated as a single unitary body or the header 34, base 36, and legs 38, 40 may be fastened together using conventional fasteners. The first leg 38 includes first and second slots 42, 44 that are vertically spaced from and aligned with one another. Respective alignment pins 46, 48 extend through the openings and define a range of motion for the utility side lockout 28. The arrangement of the header 34, shortened base 36, leg 38, and shortened leg 40 collectively define a recess 50 sized to receive the handles 52 and 54 of the utility mains breaker 18 and the utility mains neutral switch 24, respectively.

The generator side lockout 30 is similar in construction to the utility side lockout 28. The generator side lockout 30 includes a header 56, a shorted base 58, a first leg 60, and a second shortened leg 62. It is understood that the lockout 30 may also be fabricated as a single unitary body or the header 56, base 58, and legs 60, 62 may be fastened together using conventional fasteners. The first leg 60 includes first and second slots 64, 66 that are vertically spaced from and aligned with one another. Respective alignment pins 68, 70 extend through the openings and define a range of motion for the utility side lockout 30. In addition, the alignment pins 68 and 70 are aligned with pins 46 and 48, respectively. The lockout 30 also includes a recess 72 sized to receive the handles 74 and 76 of the generator mains breaker 22 and the generator mains neutral switch 20, respectively.

The rocker lockout 32 includes a rocker body 78 that is positioned generally between utility mains neutral switch 24 and the generator mains neutral switch 20. The rocker body 78 is coupled to a pivot pin 80 in a manner that allows the rocker body to be pivoted. Ears 82, 84 extend from the rocker body 78 and as will be explained limit the range of motion of the rocker lockout 32. The ears 82, 84 may be integrally formed with the rocker body 78 or may be separate components that are fastened to the rocker body 78 in a conventional manner.

In FIG. 2, the utility mains breaker switch handle 52 and the utility mains neutral switch handle 54 are both in the ON position and the generator mains breaker handle 74 and the generator mains neutral switch handle 76 are in the OFF position. When the breakers and switches are in this position, the load circuits of the load center assembly 10 are electrically connected to the utility power source. The interlock arrangement 26 is constructed and associated with the breakers and switch handles such that generator side handles 74, 76 cannot be moved to their ON positions when the utility side handles 52, 54 are in the ON position. Moreover, the utility mains neutral switch handle 54 is blocked from being moved to the OFF position by the shortened base 36 of the generator side lockout 28. For the utility mains neutral switch handle 54 to be in the ON position shown in FIG. 2, the rocker lockout 32 must be pivoted counterclockwise. This movement is only possible if the generator mains neutral switch handle 76 is in the OFF position. In addition, once the rocker lockout 32 is pivoted to the position shown in FIG. 2, the generator mains neutral switch handle 76 cannot be switched from the OFF position to the ON position.

The interlock assembly 26 forces an operator to complete a seven step sequence to manually disconnect the load center from one power source and connect it to the other power source. The seven step sequence for disconnecting the load center from the utility power source and connecting it to the generator is shown in FIGS. 3 through 10.

Figure 3:
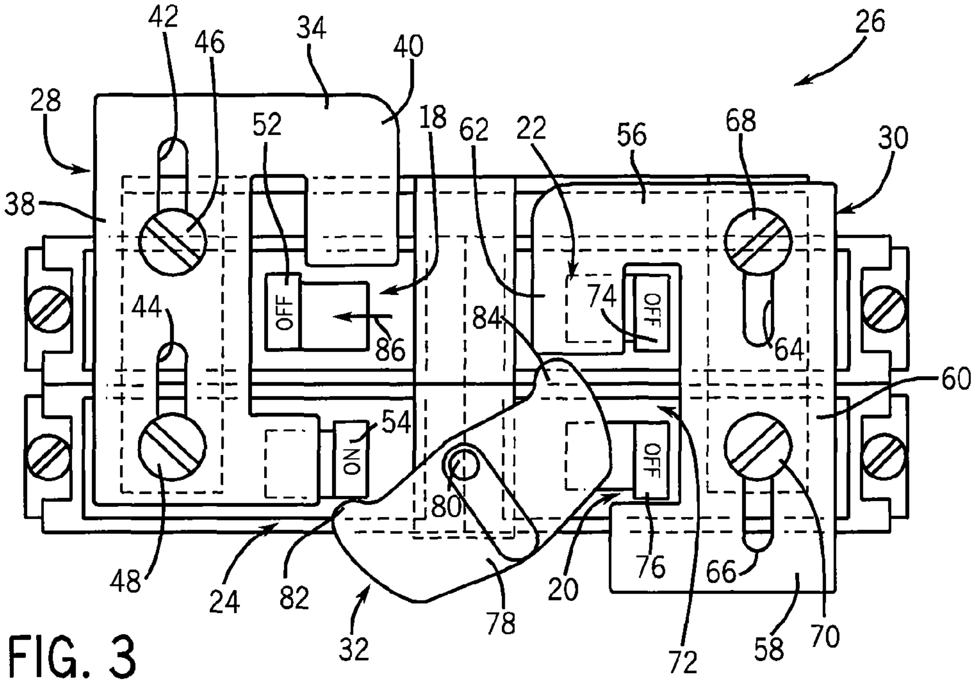
FIG. 3 is a front elevation view of the transfer panel shown in FIG. 2 with the utility mains breaker switched to an OFF position.

In the first step, shown in FIG. 3, the utility mains breaker handle 52 is moved outwardly in the direction of arrow 86 from the ON position to the OFF position. As a result of this outward movement, the switch handle 52 is moved to a position within recess 50 of the utility side lockout 28. Additionally, as a result of this movement, the switch handle 52 no longer blocks downward movement of the lockout 28. More specifically, when the switch handle 52 is in the ON position, FIG. 2, the shorted leg 40 of the lockout 28 is generally adjacent the switch handle 52. As a result, the lockout 28 cannot be slid downward along arrow 88, shown in FIG. 4.

Figure 4:
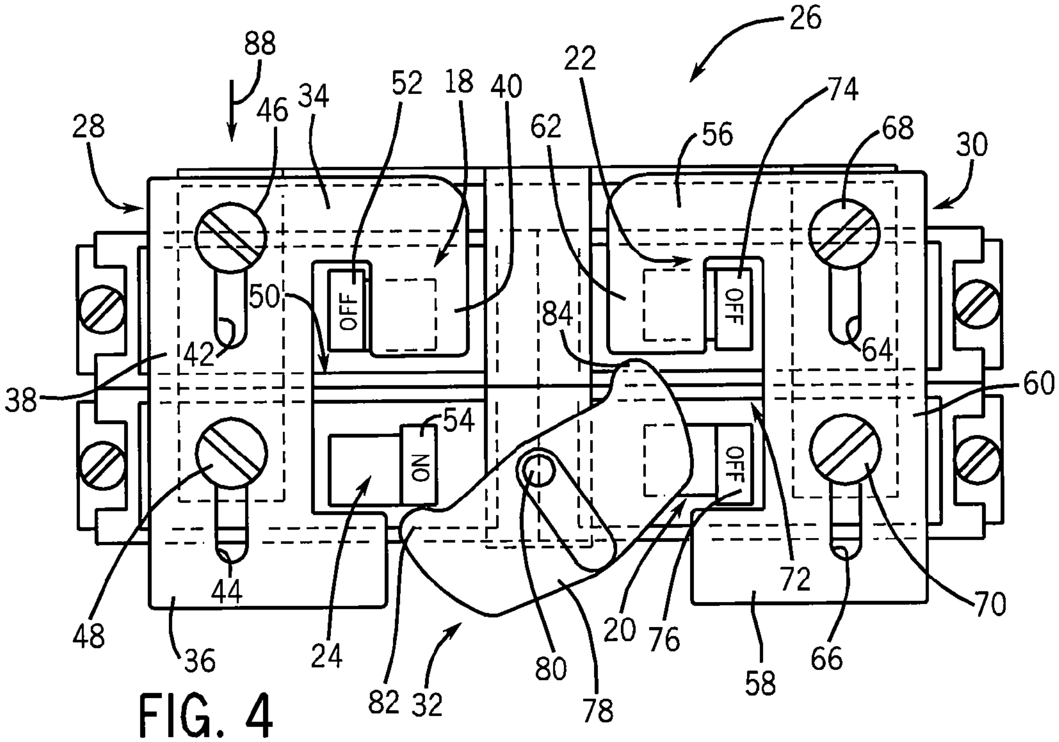
FIG. 4 is a front elevation view of the transfer panel shown in FIG. 2 with a mains side lockout sequencer having been slid to free the utility mains neutral switch.

In step 2, downward movement of the generator side lockout 28 causes the shorted leg 40 to move adjacent the utility mains breaker handle 52, as shown in FIG. 4. In this position, the switch handle 52 cannot be moved back to its ON position until the lockout 28 is slid upward. In addition, as shown in FIG. 4, the shortened base 36 of the lockout 28 also slides downward to a position below that of the utility mains neutral switch handle 54 thereby freeing the switch handle 54 to be moved to the OFF position.

Figure 5:
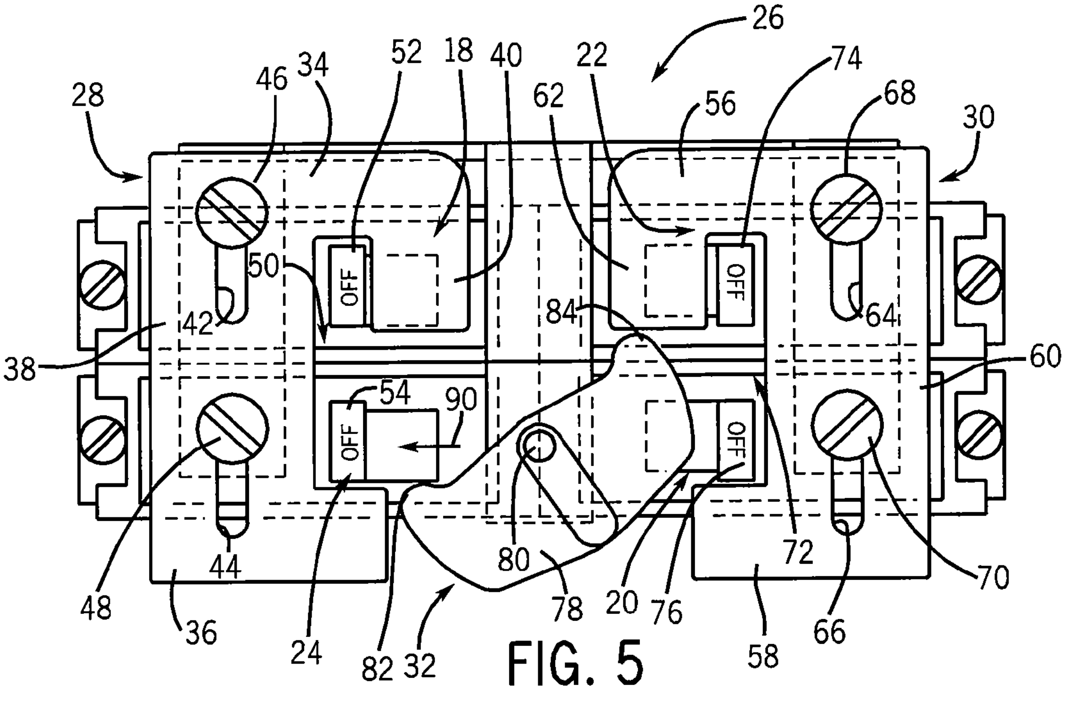
FIG. 5 is a front elevation view of the transfer panel shown in FIG. 2 with the utility mains breaker and the utility mains neutral switch switched to the OFF position and positioned within a recess formed in the mains side lockout sequencer.

Thus, at step 3, the utility mains neutral switch handle 54 can be moved outwardly along arrow 90, as shown in FIG. 5. In this position, both of the utility side switches 52, 54 are in the OFF position as are the generator side switch handles 74, 76. As such, the electrical loads are not being fed power from either power source.

Figure 6:
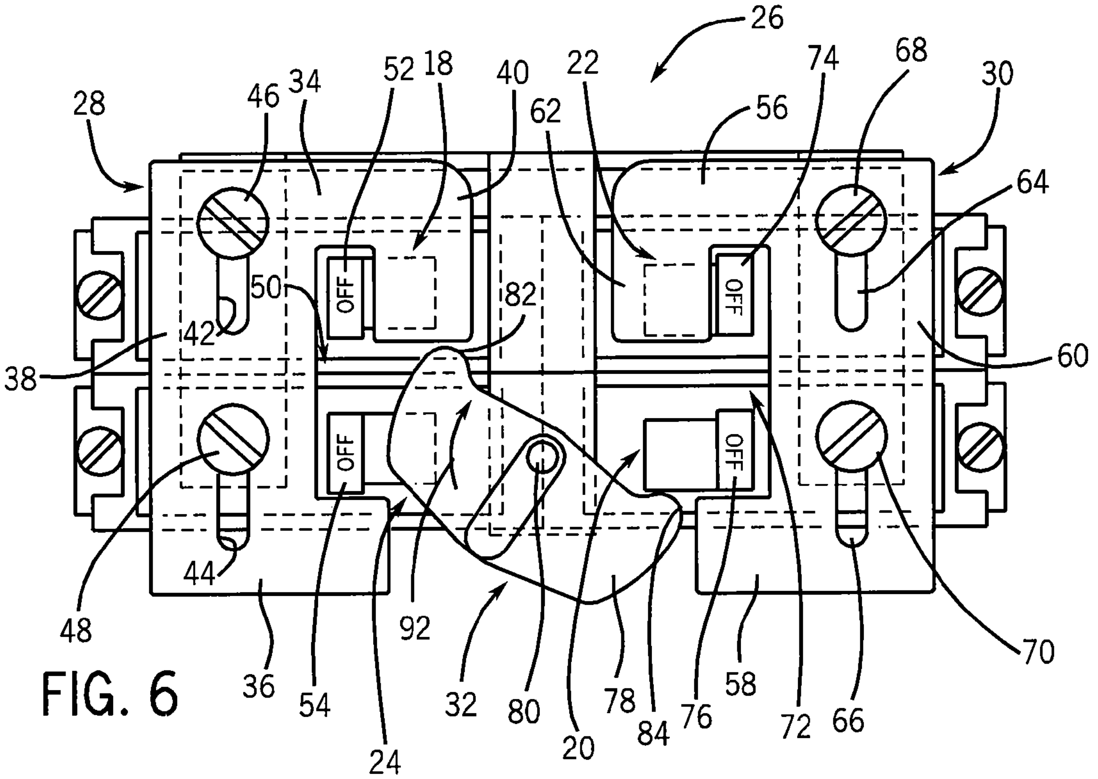
FIG. 6 is a front elevation view of the transfer panel shown in FIG. 2 with the rocker lockout pivoted upward to block the utility mains neutral switch from being switched to the ON position and to free the generator mains neutral switch.

In step 4, shown in FIG. 6, the rocker lockout 32 must be pivoted clockwise, represented by arrow 92, to free the generator mains neutral switch handle 76. This clockwise movement also causes the body 78 of the rocker lockout 32 to move adjacent to the utility mains neutral switch handle 54, which effectively impedes switching back of the switch handle 54 to its ON position. Additionally, ear 82 of the rocker lockout 32 abuts the lower surface of the shortened leg 40 of the utility side lockout 28 when the rocker lockout is fully pivoted to the position shown in FIG. 6. This abutment limits further pivoting of the rocker lockout 32 past the desired position.

Figure 7:
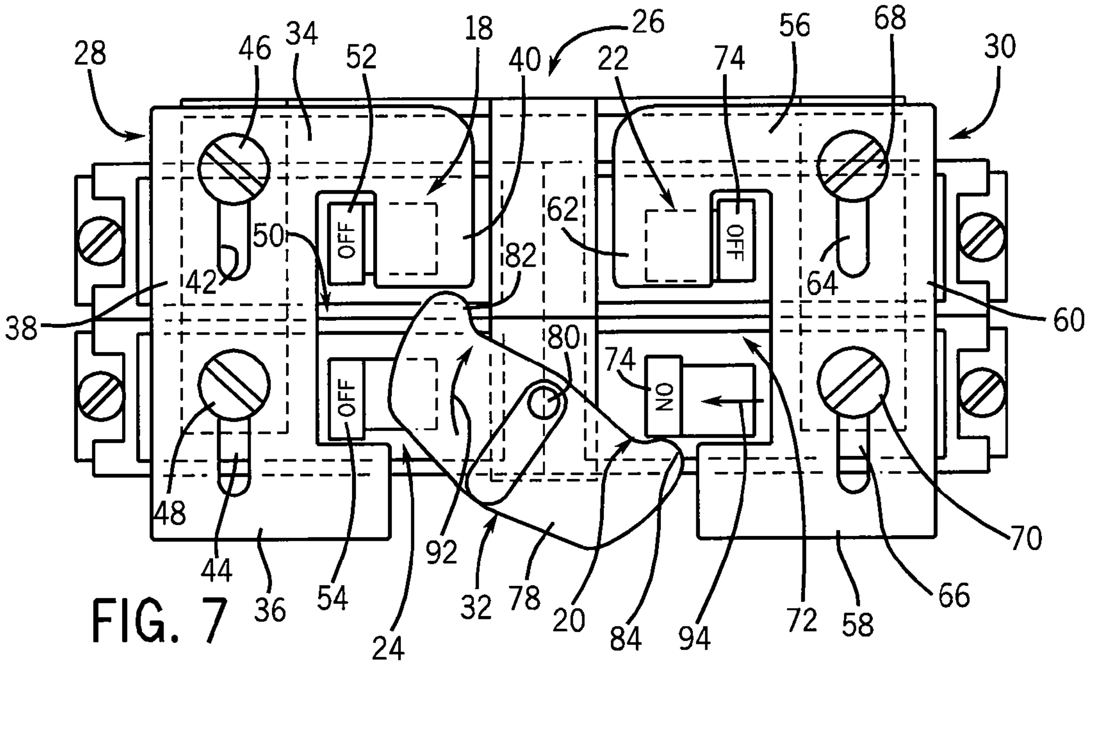
FIG. 7 is a front elevation view of the transfer panel shown in FIG. 2 with the generator mains neutral switch shown switched from an OFF position defined within a recess of a generator side lockout sequencer to an ON position.

With the generator mains neutral switch 76 free by clockwise movement of the rocker lockout 32, in step 5, the operator may then move the generator mains neutral switch handle 76 from the OFF position in the direction of arrow 94 to the ON position, as shown in FIG. 7. As further shown in FIG. 7, when the generator mains neutral switch handle 74 is moved to the ON position, the generator side lockout 30 is free to slide upwardly. More particularly, when the generator mains neutral switch handle 74 is in the OFF position, the switch handle 74 is adjacent the base 58 of the generator side lockout 30 and therefore impedes upward movement of the lockout 30.

Figure 8:
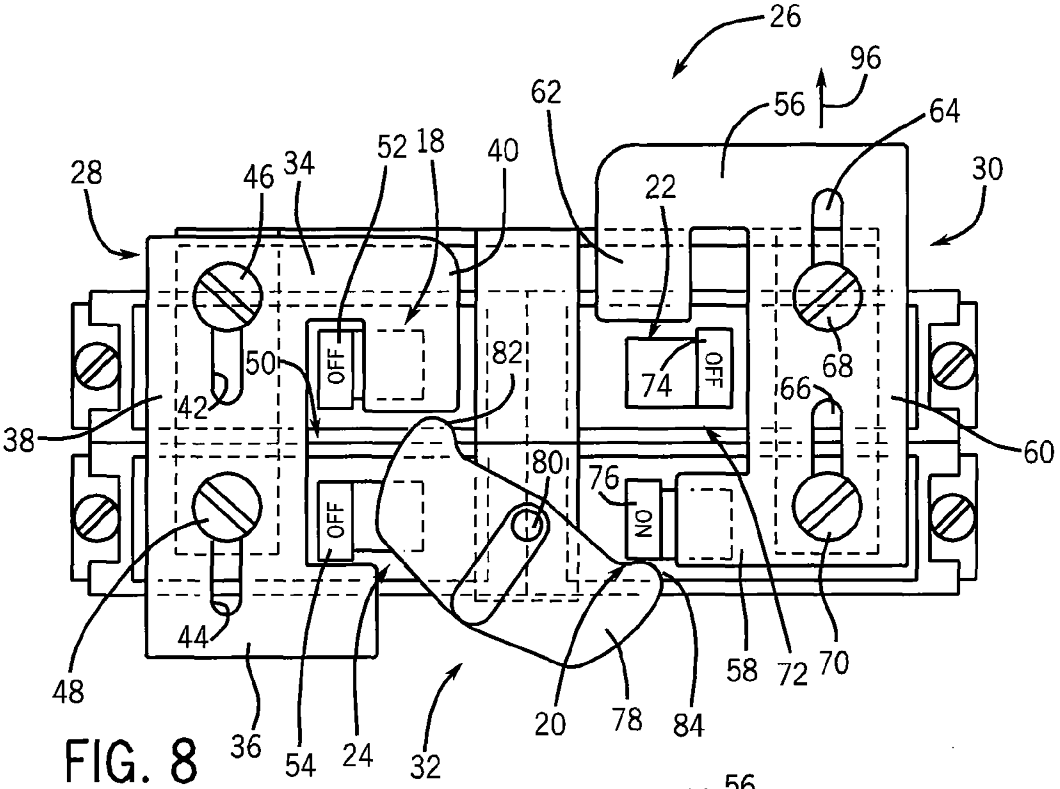
FIG. 8 is a front elevation view of the transfer panel shown in FIG. 2 with the generator side lockout sequencer having been slid to free the generator mains breaker.

In step 6, the generator side lockout 30 is slid upward in the direction of arrow 96, as shown in FIG. 8. As a result of this upward movement, the shorted leg 62 of the lockout 30 that previously was adjacent the generator mains breaker handle 74 is also moved upward away from the switch handle 74. Similarly, the base 58 of the lockout 30 slides upward to sit adjacent the generator mains neutral switch handle 76. In this position, the base 58 blocks the switch handle 76 from being moved back to its OFF position.

Figure 9:
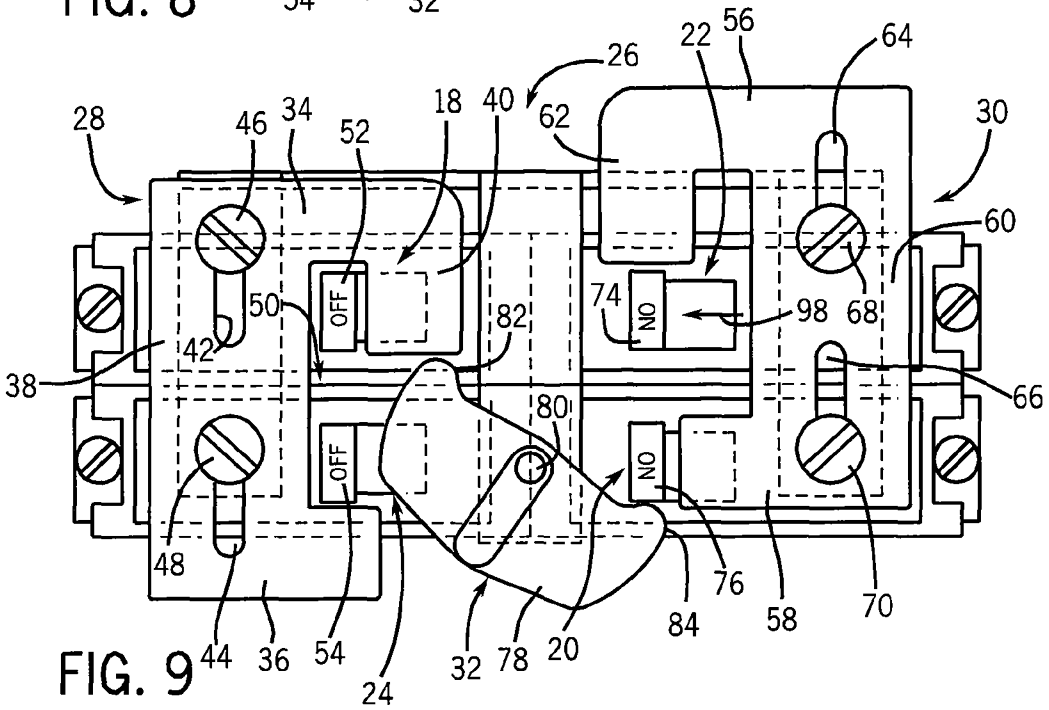
FIG. 9 is a front elevation view of the transfer panel shown in FIG. 2 with the generator mains breaker switch moved to the ON position thereby resulting in connection of a load to the generator power supply.

In step 7, shown in FIG. 9, the generator mains breaker handle 74 is switched from the OFF position to the ON position in the direction of arrow 98. When the generator mains breaker handle 74 is switched to the ON position, the load center is then electrically connected to the generator power source.

One skilled in the art will appreciate that the interlock assembly 26 forces an operator to first switch OFF the utility mains breaker, then switch OFF the utility mains neutral switch, then switch ON the generator mains neutral switch, and then switch ON the generator mains breaker to disconnect the load center 10 from the utility power supply and connect it to the generator power supply. The mechanical configuration of the interlock assembly 26 does not allow the sequence to be adjusted by the operator. In addition, one skilled in the art will appreciate that the steps described above are carried out in reverse to disconnect the load center from the generator power source and connect it to the utility power source.

Figure 10:
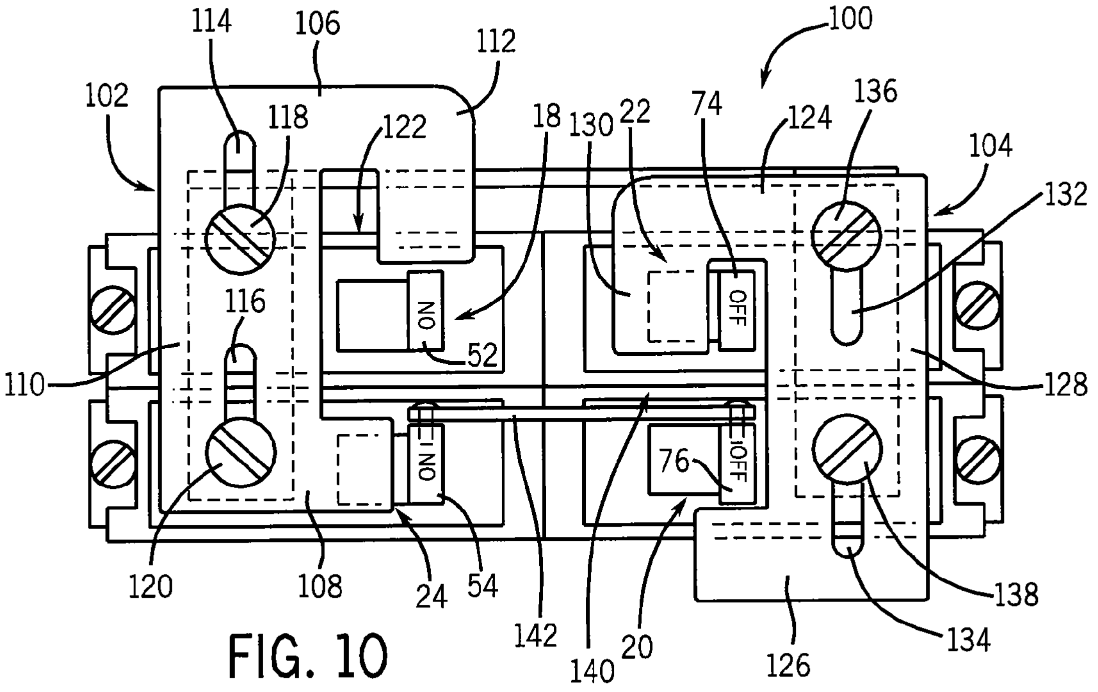
FIG. 10 is a front enlarged elevation view of a transfer panel similar to that shown in FIG. 2 according to another embodiment of the present invention containing a utility mains breaker, a generator mains breaker, and an interlinked utility mains neutral switch and generator mains neutral switch together with a lockout arrangement containing two slidable lockout sequencers and shown with the utility mains breaker and the mains neutral switch in an ON position and the generator mains breaker and the generator mains neutral switch in an OFF position.

Referring now to FIG. 10, an interlock assembly 100 according to another representative embodiment of the present invention is shown. Interlock assembly 100 sequences an operator through five steps to disconnect the load center 10 from one power source and connect it to another power source.

The interlock assembly 100 includes a pair of slidable lockouts 102, 104. Lockout 102 is associated with the utility mains breaker 18 and the utility mains neutral switch 24, and thus will be referred to as "utility side lockout" whereas lockout 104 is associated with the generator mains breaker 22 and the generator mains neutral switch 20, and thus will be referred to as "generator side lockout".

The utility side lockout 102 includes a header 106, a shorted base 108, a first leg 110, and a second shortened leg 112. It is understood that the lockout 102 may fabricated as a single unitary body or the header 106, base 108, and legs 110, 112 may be fastened together using conventional fasteners. The first leg 110 includes first and second slots 114, 116 that are vertically spaced from and aligned with one another. Respective alignment pins 118, 120 extend through the openings and define a range of motion for the utility side lockout 102. Further, the arrangement of the header 106, shortened base 108, leg 110, and shortened leg 112 collectively define a recess 122 sized to receive the handles 52 and 54 of the utility mains breaker 18 and the utility mains neutral switch 24, respectively.

The generator side lockout 104 is similar in construction to the utility side lockout 102. The generator side lockout 104 includes a header 124, a shorted base 126, a first leg 128, and a second shortened leg 130. It is understood that the lockout 104 may also be fabricated as a single unitary body or the header 124, base 126, and legs 128, 130 may be fastened together using conventional fasteners. The first leg 128 includes first and second slots 132, 134 that are vertically spaced from and aligned with one another. Respective alignment pins 136, 138 extend through the openings and define a range of motion for the utility side lockout 104. In addition, the alignment pins 136 and 138 are aligned with pins 118 and 120, respectively. Further, the lockout 104 also includes a recess 140 sized to receive the handles 74 and 76 of the generator mains breaker 22 and the generator mains neutral switch 20, respectively.

The interlock assembly 100 further has an interlinking bar 142 that is connected to the utility mains neutral switch handle 54 and the generator mains neutral switch handle 76. This interlinking of handles 54 and 76 causes the switch handles to be moved simultaneously. Thus, when handle 54 is switched to the OFF position, switch handle 76 is switched to the ON position, and vice-versa. The interlinking bar 142 represents one known means of interconnecting handles 54 and 75. It is understood that other types of interlinking configurations may be used and are considered within the scope of the present invention. One such in-line interlinking configuration is shown in U.S. Pat. No. 6,031,193, the disclosure of which is incorporated herein by reference. Another representative interlinking configuration is described in U.S. Pat. No. 6,927,349, the disclosure of which is incorporated herein by reference.

In general, the interlock assembly 100 is similar to the interlock assembly 26 shown in FIGS. 1 through 9, with the exception that the rocker lockout has been removed and replaced with the interlinking bar 142. By interlinking the neutral switch handles 54, 76, the number of steps to disconnect the load center from one power source and connect it to another power source, relative to the sequence shown in FIGS. 3 through 9 is reduced by two steps. A five-step sequence for disconnecting the load center 10 from the utility power source to the generator power source will be described with respect to FIGS. 11 through 15.

Figure 11:
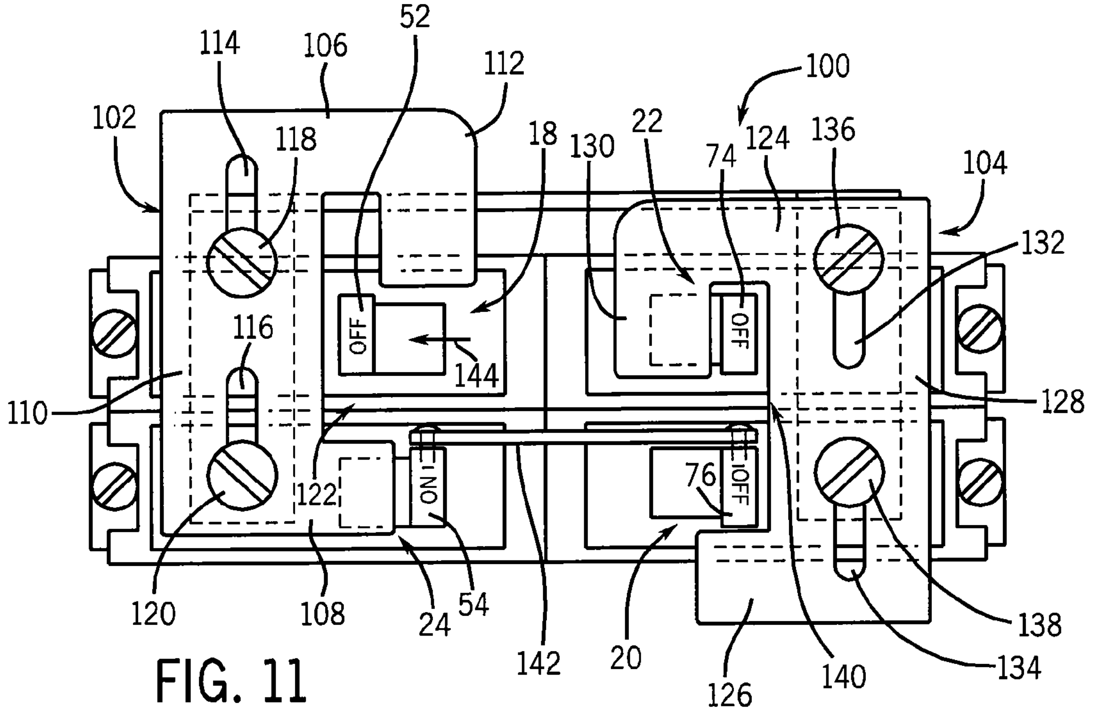
FIG. 11 is a front elevation view of the transfer panel shown in FIG. 10 with the utility mains breaker switched to an OFF position.

In the first step, shown in FIG. 11, the utility mains breaker handle 52 is moved outwardly in the direction of arrow 144 from the ON position to the OFF position. As a result of this outward movement, the switch handle 52 is moved to a position within recess 122 of the utility side lockout 102. Additionally, as a result of this movement, the switch handle 52 no longer blocks downward movement of the lockout 102. More specifically, when the switch handle 52 is in the ON position, FIG. 10, the shorted leg 112 of the lockout 102 is generally adjacent the switch handle 52. As a result, the lockout 102 cannot be slid downward along arrow 146, shown in FIG. 12.

Figure 12:
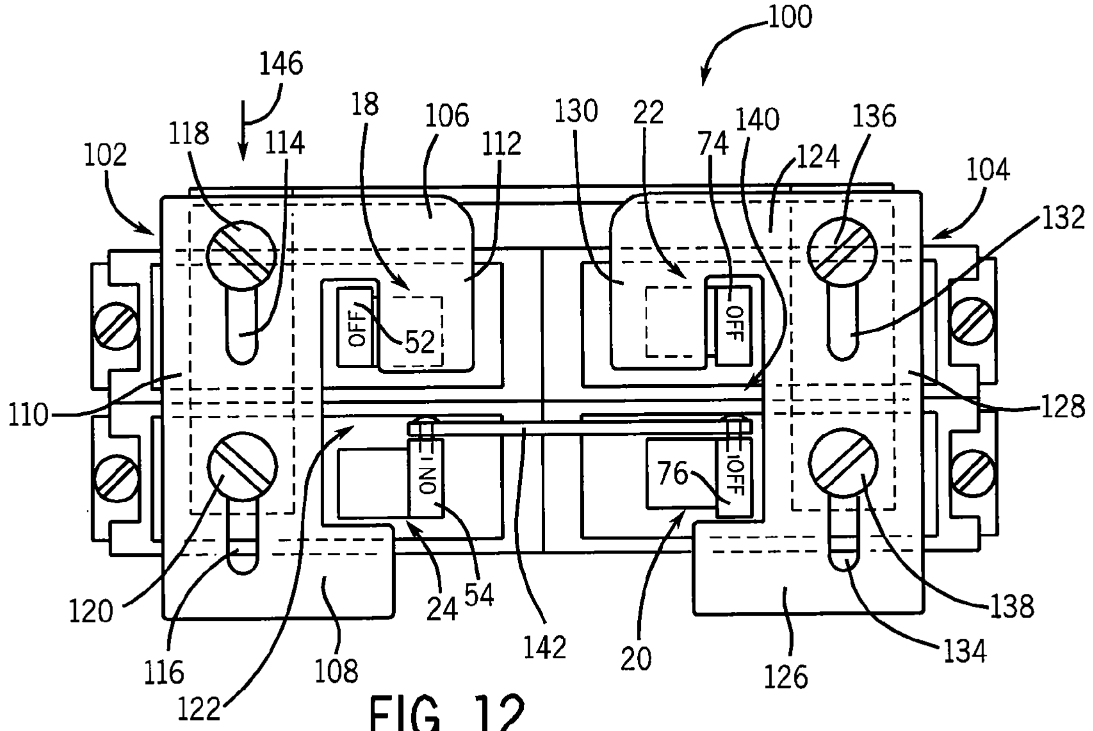
FIG. 12 is a front elevation view of the transfer panel shown in FIG. 10 with a mains side lockout sequencer having been slid to free the utility mains neutral switch.

In step 2, downward movement of the generator side lockout 102 causes the shorted leg 112 to move adjacent the utility mains breaker handle 52, as shown in FIG. 12. In this position, the switch handle 52 cannot be moved back to its ON position until the lockout 102 is slid upward. In addition, as shown in FIG. 12, the shortened base 108 of the lockout 102 also slides downward to a position below that of the utility mains neutral switch handle 54 thereby freeing the switch handle 54 to be moved to the OFF position.

Figure 13:
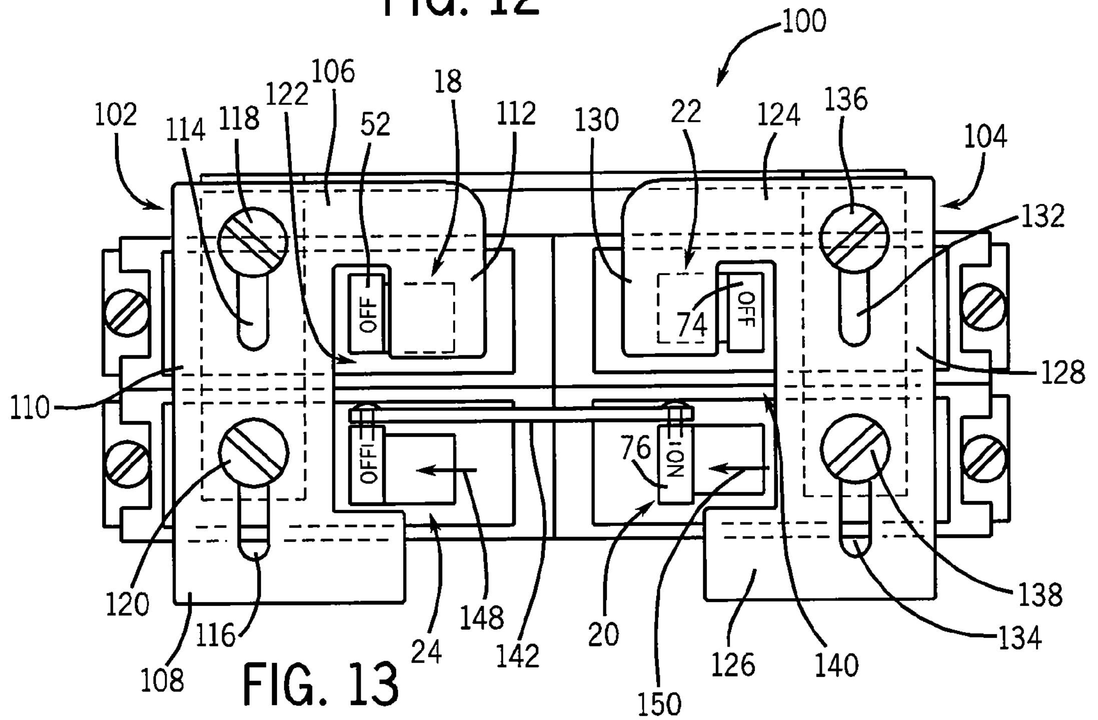
FIG. 13 is a front elevation view of the transfer panel shown in FIG. 10 with the utility mains breaker and the utility mains neutral switch switched to the OFF position and positioned within a recess formed in the mains side lockout sequencer and the generator mains neutral switch switched from the OFF position to the ON position.

Thus, at step 3, the utility mains neutral switch handle 54 is moved outwardly along arrow 148, as shown in FIG. 13. In this position, both of the utility side switches 52, 54 are in the OFF position as are the generator side switch handles 74, 76. As such, the electrical loads are not being fed power from either power source. Further, because the utility mains neutral switch handle 54 is interlinked with the generator mains neutral switch handle 76, movement of the utility neutral switch handle 54 in the direction of arrow 148 automatically causes the generator mains neutral switch handle to move in the direct of arrow 150 from the OFF position, shown in FIG. 10, to the ON position.

When the generator mains neutral switch handle 74 is in the ON position, the generator side lockout 104 is freed to slide upwardly. More particularly, when the generator mains neutral switch handle 74 is in the OFF position, the switch handle 74 is adjacent the base 126 of the generator side lockout 104 and therefore impedes upward movement of the lockout 104.

In step 4, the generator side lockout 104 is slid upward in the direction of arrow 152, as shown in FIG. 14. As a result of this upward movement, the shorted leg 130 of the lockout 104 that previously was adjacent the generator mains breaker handle 74 is also moved upward away from the switch handle 74. Similarly, the base 126 of the lockout 104 slides upward and is positioned adjacent the generator mains neutral switch handle 76. In this position, the base 126 blocks the switch handle 76 from being moved back to its OFF position, which because of the interlinking of the neutral switches 54 and 76, also prevents the utility mains neutral switch 54 from being switched to the ON position.

In step 5, shown in FIG. 15, the generator mains breaker handle 74 is switched from the OFF position to the ON position in the direction of arrow 154. When the generator mains breaker handle 74 is switched to the ON position, the load center is then electrically connected to the generator power source.

One skilled in the art will appreciate that the interlock assembly 100 forces an operator to first switch OFF the utility mains breaker, then switch OFF the utility mains neutral switch, which causes the generator mains neutral switch to be switched to the ON position, and then switch ON the generator mains breaker to disconnect the load center 10 from the utility power supply and connect it to the generator power supply. The mechanical configuration of the interlock assembly 100 does not allow the sequence to be adjusted by the operator. In addition, one skilled in the art will appreciate that the steps described above are carried out in reverse to disconnect the load center from the generator power source and connect it to the utility power source.

While the embodiments of the invention have been shown and described in connection with manual movement of the various components, it should also be understood that movement of some or all of the components may be accomplished using conventional actuating devices.

Various alternatives and embodiments are contemplated as being within the scope of the following claims particularly pointing out and distinctly claiming the subject matter regarded as the invention.

I claim:

1. A lockout arrangement for use with a separately-derived transfer switch having a mains switch, a generator switch, a mains neutral switch, and a generator neutral switch, the arrangement comprising:

a first movable lockout movable between a first position and a second position, wherein the first movable lockout controls movement of the mains switch and the mains neutral switch;

a second movable lockout movable between a third position and a fourth position, wherein the second movable lockout controls movement of the generator switch and the generator neutral switch; and a third lockout movable between a fifth position and a sixth position, and wherein the third lockout is only movable from the fifth position to the sixth position if the first movable lockout is in the second position;

wherein the first movable lockout restricts simultaneous switching of the mains switch and the mains neutral switch, the second movable lockout restricts simultaneous switching of the generator switch and the generator neutral switch, and the third lockout prevents both the mains neutral switch and the generator neutral switch from being in a conductive position simultaneously.

2. The arrangement of claim 1 wherein the first and second movable lockouts are slidable lockouts, and wherein the first slidable lockout is movable from the first position to the second position if the mains switch is in an OFF position.

3. A lockout arrangement for use with a separately-derived transfer switch having a mains switch, a generator switch, a mains neutral switch, and a generator neutral switch, the arrangement comprising:

a first movable lockout movable between a first position and a second position;

a second movable lockout movable between a third position and a fourth position;

wherein the first and second movable lockouts are slidable lockouts, and wherein the first slidable lockout is movable from the first position to the second position if the mains switch is in an OFF position; and a third lockout movable between a fifth position and a sixth position, wherein the third lockout is only movable from the fifth position to the sixth position if the first movable lockout is in the second position, and wherein the third lockout is movable from the sixth position to the fifth position only if the mains neutral switch is in an ON position and the generator neutral switch is in an OFF position.

4. The arrangement of claim 3 wherein the third lockout is movable from the sixth position to the fifth position only if the second slidable lockout is in the fourth position.

5. The arrangement of claim 4 wherein the second slidable lockout is movable from the third position to the fourth position only if the generator switch is in an OFF position.

6. A lockout arrangement for use with a separately-derived transfer switch having a mains switch, a generator switch, a mains neutral switch, and a generator neutral switch, the arrangement comprising:

a first movable lockout movable between a first position and a second position;

a second movable lockout movable between a third position and a fourth position; and a third lockout movable between a fifth position and a sixth position, wherein the third lockout is only movable from the fifth position to the sixth position if the first movable lockout is in the second position;

wherein the first and second movable lockouts are slidable lockouts, and wherein the second slidable lockout is movable from the fourth position to the third position only if the generator neutral switch is in an ON position.

7. A lockout arrangement for use with a separately-derived transfer switch having a mains switch, a generator switch, a mains neutral switch, and a generator neutral switch, the arrangement comprising:

a first movable lockout movable between a first position and a second position;

a second movable lockout movable between a third position and a fourth position; and a third lockout movable between a fifth position and a sixth position, and wherein the third lockout is only movable from the fifth position to the sixth position if the first movable lockout is in the second position;

wherein the first and second movable lockouts are slidable lockouts, and wherein the first slidable lockout, the second slidable lockout, and the third lockout collectively prevent any two of the mains switch, generator switch, mains neutral switch, and generator neutral switch from being switched simultaneously.

8. A lockout arrangement for use with a separately-derived transfer switch having a mains switch, a generator switch, a mains neutral switch, and a generator neutral switch, the arrangement comprising:

a first movable lockout movable between a first position and a second position;

a second movable lockout movable between a third position and a fourth position; and a third lockout movable between a fifth position and a sixth position, wherein the third lockout is only movable from the fifth position to the sixth position if the first movable lockout is in the second position, and wherein the third lockout is fixedly connected to the generator neutral switch and the mains neutral switch.

9. A separately-derived transfer switch for switchably connecting a load to either a first power supply or a second power supply, the transfer switch comprising:

a first main switch associated with the first power supply;

a second main switch associated with the second power supply;

a first neutral switch associated with the first power supply;

a second neutral switch associated with the second power supply;

a lockout sequencer arrangement having a first lockout that restricts simultaneous switching of the first main switch and the first neutral switch, a second lockout that restricts simultaneous switching of the second main switch and the second neutral switch, and a third lockout that prevents both the first neutral switch and the second neutral switch from being in a conductive position simultaneously.

10. The transfer switch of claim 9 further comprising a linkage interconnecting the first neutral switch and the second neutral switch.

11. The transfer switch of claim 9 wherein the third lockout is a rocker switch.

12. The transfer switch of claim 9 wherein the first lockout includes a first pair of arms positioned relative to the first main switch and the first neutral switch such that only one of the first main switch and the first neutral switch can be switched at a time and wherein the second lockout includes a second pair of arms positioned relative to the second main switch and the second neutral switch such that only one of the second main switch and the second neutral switch can be switched at a time.

13. The transfer switch of claim 12 wherein the first pair of arms define a first recess sized to sequentially receive both the first main switch and the first neutral switch and wherein the second pair of arms define a second recess sized to sequentially receive both the second main switch and the second neutral switch.

14. The transfer switch of claim 13 wherein the first lockout and the second lockout are each slidable along a first axis and the first main switch, the second main switch, the first neutral switch, and the second neutral switch are each slidable along a second axis transverse to the first axis.

15. A method of disconnecting a load from a mains power supply and connecting the load to a generator, comprising:

(a) switching a mains switch from an ON position to an OFF position; then (b) sliding a mains side lockout from a first position to a second position; then (c) switching a mains neutral switch from an ON position to an OFF position; then (d) switching a generator neutral switch from an OFF position to an ON position; then (e) sliding a generator side lockout from a third position to a fourth position; and then (f) switching a generator switch from an OFF position to an ON position.

16. The method of claim 15 further comprising rotating a rocker switch from a first position to a second position to permit switching of the generator neutral switch from the OFF position to the ON position.

17. The method of claim 15 wherein switching the mains neutral switch and switching the generator neutral switch occurs simultaneously.

18. The method of claim 15 wherein the mains side lockout includes a recess, and wherein switching the mains switch to the OFF position includes moving the mains switch to a position within the mains side lockout recess and wherein switching the mains neutral switch to the OFF position includes moving the mains neutral switch to a position within the mains side lockout recess.

19. The method of claim 15 wherein the generator side lockout includes a recess, and wherein switching the generator neutral switch to the ON position includes moving the generator neutral switch from a position within the generator side lockout recess to a position outside the generator side lockout recess and wherein switching the generator switch to the ON position includes moving the generator switch from a position within the generator side lockout recess to a position outside the generator side lockout recess.

20. The method of claim 15 further comprising repeating steps (a)-(f), in reverse order, to disconnect the load from the generator power supply and to reconnect the load to the mains power supply.

* * * * *